United States Patent [19]
Kobayashi

[11] Patent Number: 4,810,669
[45] Date of Patent: Mar. 7, 1989

[54] METHOD OF FABRICATING A SEMICONDUCTOR DEVICE

[75] Inventor: Motoki Kobayashi, Tokyo, Japan

[73] Assignee: Oki Electric Industry Co., Ltd., Tokyo, Japan

[21] Appl. No.: 215,623

[22] Filed: Jul. 6, 1988

[30] Foreign Application Priority Data

Jul. 7, 1987 [JP] Japan ................ 62-167864

[51] Int. Cl.$^4$ .................. H01L 21/465; H01L 21/471
[52] U.S. Cl. ...................... 437/67; 437/231; 156/643; 156/662
[58] Field of Search .............. 437/67, 78, 79, 231; 156/643, 668, 662

[56] References Cited

U.S. PATENT DOCUMENTS

| | | | |
|---|---|---|---|
| 4,038,110 | 7/1977 | Feng | 437/68 |
| 4,046,595 | 9/1977 | Ohkubo et al. | 437/958 |
| 4,359,512 | 11/1982 | Fukuda et al. | 430/57 |
| 4,627,988 | 12/1986 | Spanjer | 427/5 |
| 4,741,926 | 5/1988 | White et al. | 427/240 |
| 4,764,483 | 8/1988 | Fuse et al. | 437/67 |

FOREIGN PATENT DOCUMENTS 170951 9/1985 Japan.
226141 11/1985 Japan.
226128 11/1985 Japan.

Primary Examiner—Olik Chaudhuri
Attorney, Agent, or Firm—Spencer & Frank

[57] ABSTRACT

In a method of fabricating a semiconductor device, a trench is formed on a semiconductor substrate on which a circuit element or electrode conductor is formed, and is filled with polysilicon, a planarizing material is applied with polyvinyl alcohol (PVA) aqueous solution onto the polysilicon to form a PVA film, and the entire surface of the semiconductor substrate is dry-etched with etching conditions that makes the ratio of the etching rate of the PVA film and the polysilicon film to be within the range of 1:1 to 1:2.

5 Claims, 3 Drawing Sheets

METHOD OF FABRICATING A SEMICONDUCTOR DEVICE

BACKGROUND OF THE INVENTION

The present invention relates to a method of fabricating a semiconductor device, and particularly to planarization of a polysilicon film which is one constituent film of a semiconductor device, and which for example is deposited to fill a trench such as a hole or groove provided in a silicon substrate. The invention provides a particular advantage where the trench is a deep trench having an aspect ratio (depth/width) of more than 1 (unity).

Prior-art examples of technology for depositing polysilicon to fill a trench such as a hole or groove formed in a silicon substrate for the purpose of planarization are disclosed in Japanese Patent Application Laid-open No. 226141/1985, Japanese Patent Application Laid-open No. 170951/1985, and Japanese Patent Application Laid-open No. 226128/1985.

With increasing demand for higher integration of a semiconductor devices, such as dynamic random access memory (DRAM) the trench capacitor configuration is often adopted. In trench capacitor configuration, a trench such as a hole (a trench with a limited length) or groove (a trench with a considerable length, such as a one surrounding a memory cell) is formed in a silicon substrate and the surface perpendicular to the principal plane of the substrate is utilized for the formation of the electrode.

The details of the process of formation of the trench capacitor differ from one cell configuration to the another. But it generally comprises a step of forming a trench such as a hole or groove in a silicon substrate, a step for depositing a gate electrode, and a step of subsequently planarizing the surface of the substrate.

FIG. 1A to FIG. 1C show an example of planarization process. For simplicity of illustration, the gate electrode is omitted. First, as illustrated in FIG. 1A, a stopper oxide film 2 is formed in a deep trench 1a with a width W0 of the opening formed in a silicon substrate 1.

Next, as shown in FIG. 1B, filling polysilicon 3 is formed by CVD (chemical vapor deposition) to a thickness of not smaller than ½ of the width W1 of the opening. Thereafter, reactive ion etching (RIE) is performed to etch and remove the polysilicon 3 until the stopper oxide film 2 is exposed, as shown in FIG. 1C.

A problem associated with the above-described method is that a small dent 5 is formed in the center of the area in which the trench has been filled with polysilicon 3. Moreover, the central region 4 of the area in which the trench has been filled with the polysilicon 3 is formed of a joint of the films that have grown from opposite sides so that the etching rate of this region is high. As a result, a step 6, as shown in FIG. 1C, is formed.

The dimension of the step 6 has a correlation with the film thickness of the polysilicon 3. With the smaller film thickness of the polysilicon 3, the dimension of the step 6 is increased.

To reduce the dimension of the step 6, precise control on the termination of etching of the polysilicon 3 is required. This is because when the stopper oxide film 2 is exposed, the surface of the polysilicon is reduced and the etching rate of the polysilicon 3 is rapidly increased. This means that fluctuation of the detection of the termination leads to fluctuation of dimension of the step 6.

The step will result in a step in the underlying layer during the subsequent conductor layer formation and can cause disconnection or etching residue.

A measure to prevent the step formation is to apply organic or inorganic planarizing material onto the polysilicon and then uniformly etch from the planarized surface.

However, resist, polyimide or coating-type $SiO_2$ film, known as organic or inorganic planarizing material had to be applied to a great thickness to be sufficiently plane.

When the thick planarizing material is used, the time required for uniformly etching the planarizing material and the polysilicon 3 is long.

Moreover, it was very difficult to control the etching rates of the underlying polysilicon and the planarizing material to be equal, and perform uniform etch-back.

SUMMARY OF THE INVENTION

An object of the invention is to eliminate the steps that occurred after the planarization with the use of polysilicon filling the deep trenches, such as holes, or grooves, thereby to prevent disconnection and etching residue.

Another object of the invention is to reduce the time required for etching.

According to the invention, there is provided a method of fabricating a semiconductor device comprising the steps of:

(a) forming a trench on a semiconductor substrate;
(b) filling the trench with polysilicon;
(c) applying a planarizing material with polyvinyl alcohol aqueous solution onto the polysilicon to form a polyvinyl alcohol film; and
(d) performing a dry etching over the entire surface of the semiconductor substrate with etching conditions that makes the ratio of the etching rate of the polyvinyl alcohol film and polysilicon film to be within the range of 1:1 to 1:2.

The planarizing material formed of polyvinyl alcohol aqueous solution can be applied uniformly at a small thickness. It can be planarized when subjected to etch-back.

BRIEF DESCRIPTION OF THE INVENTION

DESCRIPTION OF THE PREFERRED EMBODIMENTS

An embodiment of a method of fabricating a semiconductor device according to the invention will now be described with reference to FIG. 2A to FIG. 2D. The illustrated embodiment concerns a process for forming a trench cell.

Figure 1A:
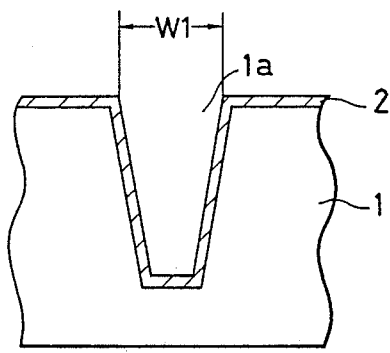
FIG. 1A to FIG. 1C are sectional diagrams showing a prior art method of fabricating a semiconductor device.
Figure 1B:
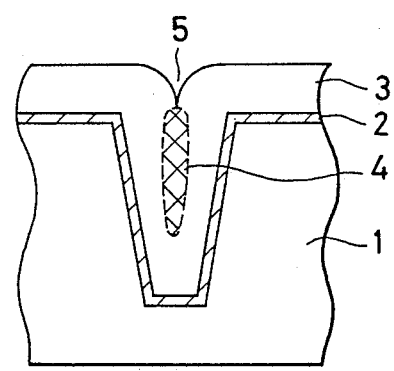
Figure 1C:
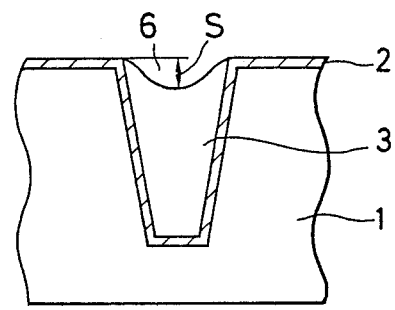
Figure 2A:
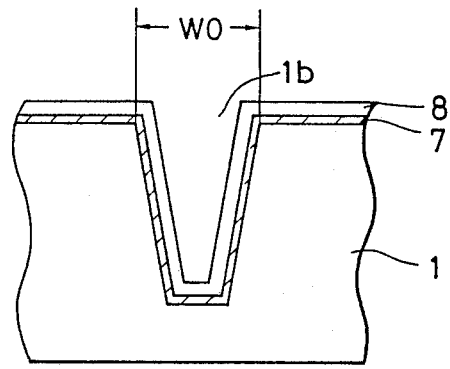
FIG. 2A to FIG. 2D are sectional diagrams showing an embodiment of a method of fabricating a semiconductor device according to the invention.

First, a trench 1b is formed in a silicon substrate 1, and then a gate oxide film 7 having a thickness of about 200 Å and 300 Å and gate polysilicon film 8 having a thickness of about 3000 Å to 4000 Å are formed, as shown in FIG. 2A.

Figure 2B:
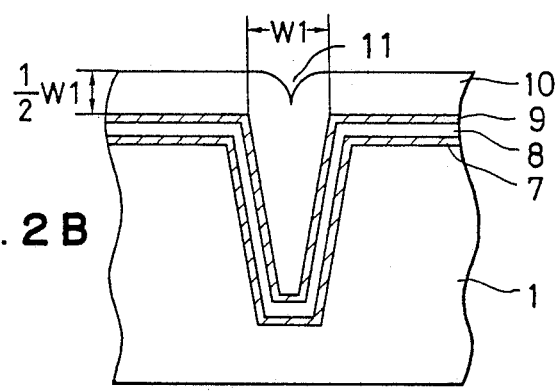
Figure 2C:
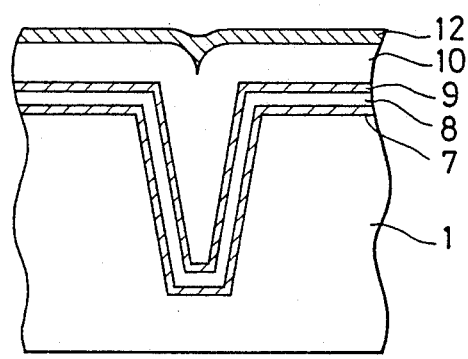

Then, as shown in FIG. 2B, a thermal oxide film 9 and a polysilicon layer 10 are formed in turn on the gate polysilicon 8. The thermal oxide film 9 is used as a stopper when the polysilicon layer 10 is later etched. If the width of the opening of the trench 1b is W1, the polysilicon layer 10 for filling the trench 1b is grown to a thickness of not less than W$\frac{1}{2}$.

The depth of the dent 11 formed after the filling with the polysilicon layer 10 can be as large as W$\frac{1}{2}$. In order not to form a step after the planarization, the polysilicon layer 10 should be formed to a thickness of not less than W$\frac{1}{2}$.

Next, an oxide film formed spontaneously on the polysilicon 10 is removed, and then polyvinyl alcohol (hereinafter referred to as PVA) aqueous solution is spincoated to form a PVA layer 12.

The thickness of the PVA layer 12 must be adjusted depending on the depth of the dent 11. For instance, if the width W0 of the opening of the trench 1B formed in a silicon substrate 1 is 1.5 $\mu$m to 2.5 $\mu$m, the width W1 of the opening after the formation of the thermal oxide film 9, i.e., the width of the opening before the filling is estimated to be 0.9 $\mu$m to 1.9 $\mu$m.

If the thickness of the filling polysilicon 10 is 1.0 $\mu$m, the depth of the dent 11 will be both about 0.4 $\mu$m to 1.0 $\mu$m.

When PVA aqueous solution for planarization is spin-coated on the polysilicon 10, the thickness of the PVA layer 12 will depend on the speed of spinning and the concentration of the PVA aqueous solution. The speed of spinning and the concentration of the PVA aqueous solution should therefore be adjusted depending on the width W1 and the thickness of the polysilicon layer 10.

When the depth of the dent 11 is 0.4 $\mu$m to 1.0 $\mu$m, the thickness of the PVA layer 12 is suitably 1000 Å to 1500 Å. By etching the PVA layer 12 and polysilicon layer 10 throughout the entire surface, complete planarization is achieved.

To achieve uniform application of the PVA layer 12 to a thickness of 1000 Å to 1500 Å using a 5% PVA aqueous solution, the optimum spinning speed is 1700 rpm.

To improve the uniformity of the thickness of the PVA layer 12, it is preferable to adopt a slower spinning speed until the PVA solution spreads throughout the entire surface, and then the spinning is performed at a higher, fixed speed.

Since the PVA is water-soluble, it is easy to change the concentration. Moreover, the PVA is dried quickly, so that the baking time after the coating can be reduced.

Figure 2D:
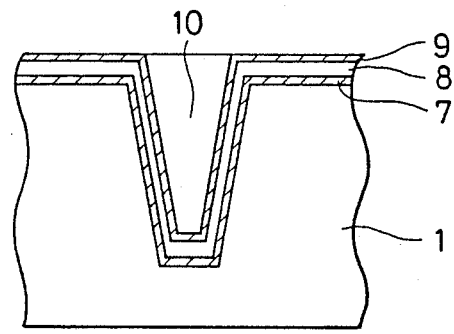

Next, as shown in FIG. 2D, the PVA layer 12 is etched throughout the entire surface by use of an RIE equipment until the thermal oxide film 9 is exposed.

To achieve a complete planarization, it is desirable that the ratio of the etching rate between the PVA and the polysilicon be within the range of 1:1 to 1:2 and the RIE conditions be such that the PVA and the polysilicon be etched uniformly.

Figure 3:
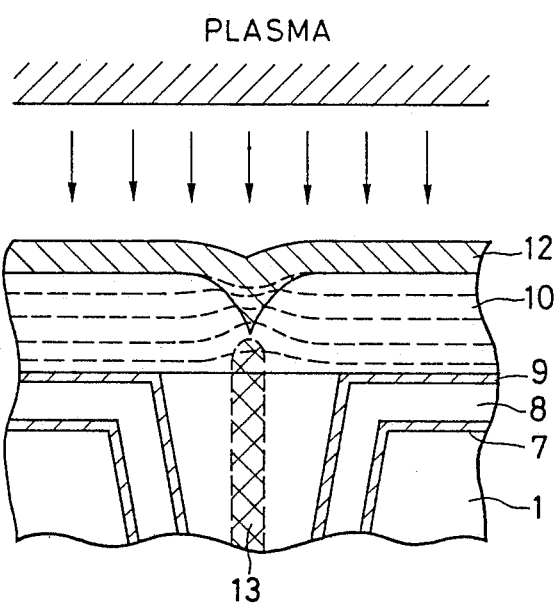
FIG. 3 is a sectional diagram showing the planarization of the polysilicon used for filling in the embodiment of FIG. 2A to FIG. 2D.

When the depth of the dent 11 is 0.4 $\mu$m to 1.0 $\mu$m, and the PVA layer 12 is formed to a thickness of 1200 Å using 5% PVA aqueous solution, it is possible to etch the PVA layer 12 and the polysilicon layer 10 to achieve a complete planarization, as illustrated in FIG. 3. This etching process uses RIE technique which is performed in a paralleltype anode-coupling RIE equipment, with $SF_6/C_2ClF_5$ mixture gas with a flow rate of 15SCCM and the pressure of 20Pa, and the high frequency power is 60 W.

With the above RIE conditions, the etching rates of the polysilicon and the PVA are 1900 Å/min., and 990 Å/min., respectively. The uniformity of the etching rate throughout the wafer is about ±6%. It is therefore important that the ratio of the etching rate between the PVA and the polysilicon should be within the range of 1:1 to 1:2.

As shown in FIG. 3, the region 13 of the polysilicon layer 10 under the dent 11 has a poor film quality so that the etching rate is higher. By using RIE conditions in which the etching rate of the PVA is lower than the etching rate of the polysilicon, the dent of the polysilicon is protected by the PVA, and the etching of the region 13 under the dent is delayed. This makes it possible to achieve a complete planarization after the etching.

Insulating films and conductor layers formed on this completely planarized surface without steps can be made completely plane. This reduces the possiblity of occurrence of disconnection and the etching residue. The reliability of the devices produced and the productivity of the process are thereby improved.

Moreover, the use of the PVA aqueous solution will make it possible to reduce the polysilicon film thickness and the planarizing material layer thickness. The time required for the etch-back can therefore be shortened.

What is claimed is:

1. A method of fabricating a semiconductor device comprising the steps of:
   (a) forming a trench on a semiconductor substrate;
   (b) filling the trench with polysilicon;
   (c) applying a planarizing material with polyvinyl alcohol aqueous solution onto said polysilicon to form a polyvinyl alcohol film; and
   (d) performing a dry etching over the entire surface of the semiconductor substrate with etching conditions that makes the ratio of the etching rate of said polyvinyl alcohol film and said polysilicon film to be within the range of 1:1 to 1:2.

2. A method according to claim 1, wherein said substrate has a circuit element and electrode conductor formed therein.

3. A method according to claim 1, wherein said semiconductor is silicon.

4. A method according to claim 1, wherein said step of applying the polyvinyl alcohol aqueous solution comprises spin-coating the polyvinyl alcohol aqueous solution.

5. A method according to claim 4, wherein said step of spin-coating the polyvinyl alcohol aqueous solution comprises spin-coating at a lower speed until the entire surface is covered with the polyvinyl alcohol aqueous solution and then spin-coating at a higher speed.

* * * * *